US011929273B2

(12) United States Patent
Kuo et al.

(10) Patent No.: US 11,929,273 B2
(45) Date of Patent: Mar. 12, 2024

(54) SEMICONDUCTOR FABRICATION SYSTEM AND METHOD

(71) Applicant: TAIWAN SEMICONDUCTOR MANUFACTURING COMPANY LIMITED, Hsin-Chu (TW)

(72) Inventors: Tsung-Sheng Kuo, New Taipei (TW); Chih-Hung Huang, Hsinchu County (TW); Guan-Wei Huang, Hsinchu County (TW); Ping-Yung Yen, Kaohsiung (TW); Hsuan Lee, Tainan (TW); Jiun-Rong Pai, Jhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 754 days.

(21) Appl. No.: 16/939,820

(22) Filed: Jul. 27, 2020

(65) Prior Publication Data
US 2021/0066104 A1 Mar. 4, 2021

Related U.S. Application Data

(60) Provisional application No. 62/894,303, filed on Aug. 30, 2019.

(51) Int. Cl.
*H01L 21/67* (2006.01)
*H01L 21/673* (2006.01)
*H01L 21/677* (2006.01)

(52) U.S. Cl.
CPC .. *H01L 21/67373* (2013.01); *H01L 21/67303* (2013.01); *H01L 21/67706* (2013.01); *H01L 21/6773* (2013.01); *H01L 21/67736* (2013.01)

(58) Field of Classification Search
CPC ......... H01L 21/67373; H01L 21/67303; H01L 21/67706; H01L 21/6773; H01L 21/67736; H01L 21/67121; H01L 21/6732; H01L 21/67333; H01L 21/67766; H01L 21/67769; H01L 21/67703; H01L 21/67011
See application file for complete search history.

(56) References Cited

U.S. PATENT DOCUMENTS

| 7,740,437 | B2* | 6/2010 | De Ridder | ........ H01L 21/67769 414/940 |
|---|---|---|---|---|
| 10,515,834 | B2* | 12/2019 | Salek | ................ H01L 21/67126 |
| 11,798,818 | B2* | 10/2023 | Yonekawa | ............ G03F 7/0002 |
| 2006/0090849 | A1* | 5/2006 | Toyoda | ............. H01L 21/67766 156/345.32 |
| 2017/0125272 | A1* | 5/2017 | van Gogh | ......... H01L 21/67178 |

* cited by examiner

*Primary Examiner* — Bayan Salone
(74) *Attorney, Agent, or Firm* — COOPER LEGAL GROUP, LLC

(57) ABSTRACT

A system and computer-implemented method are provided for manufacturing a semiconductor electronic device. An assembler receives a jig and a boat supporting a die. The assembler includes a separator that separates the jig into a first jig portion and a second jig portion and a loader that positions the boat between the first jig portion and the second jig portion. A robot receives an assembly prepared by the assembler and manipulates a locking system that fixes an alignment of the boat relative to the first jig portion and the second jig portion to form a locked assembly. A process chamber receives the locked assembly and subjects the locked assembly to a fabrication operation.

20 Claims, 8 Drawing Sheets

SEMICONDUCTOR FABRICATION SYSTEM AND METHOD

CROSS-REFERENCE TO RELATED APPLICATIONS

This application claims the benefit of U.S. Provisional Application No. 62/894,303, filed Aug. 30, 2019, which is incorporated in its entirety herein by reference.

BACKGROUND

Semiconductor fabrication processes, such as very-large-scale integration (VLSI), create integrated circuits by forming networks of transistors and other circuit components on a single chip, commonly referred to as a die. Several dies can be formed on a single wafer, or dies can be processed individually after being cut from a wafer. Due to the number of circuit components included in modern integrated circuits, the fabrication processes have become increasingly complex. Dies, whether formed as part of a wafer or having been cut from a wafer, are transported to various different treatment chambers, process tools, and fabrication bays to be subjected to a sequence of processing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
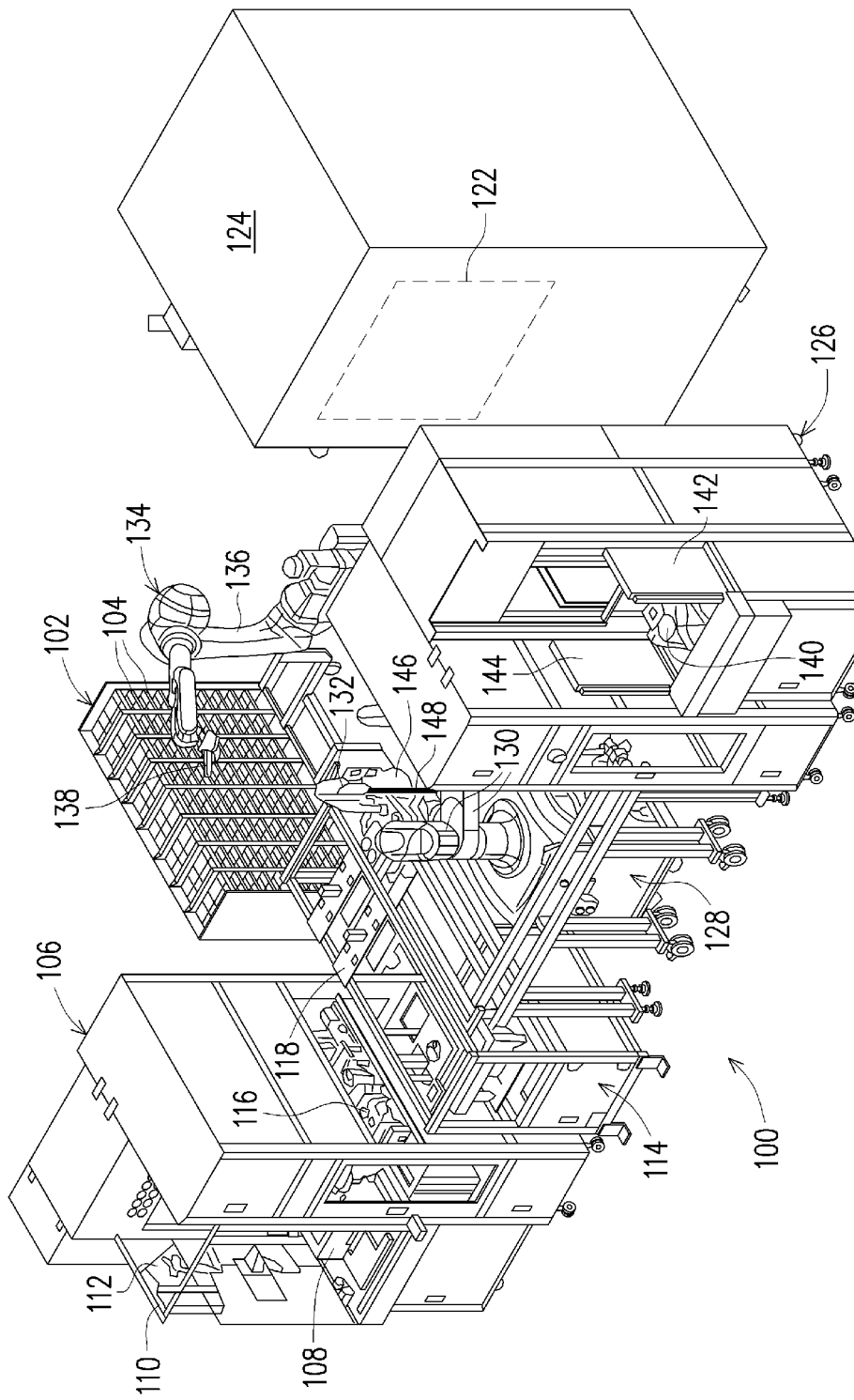
FIG. 1 illustrates a system for manufacturing a semiconductor electronic device, in accordance with some embodiments.

Aspects of the present disclosure are best understood from the following detailed description when read with the accompanying FIGs. It is noted that, in accordance with the standard practice in the industry, various features are not drawn to scale. In fact, the dimensions of the various features may be arbitrarily increased or reduced for clarity of discussion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the Figs. The spatially relative terms are intended to encompass different orientations of the device in use or operation in addition to the orientation depicted in the Figs. The apparatus may be otherwise oriented (rotated 90 degrees or at other orientations) and the spatially relative descriptors used herein may likewise be interpreted accordingly.

According to some embodiments, a system and process for manufacturing a semiconductor device are provided. The system comprises an assembler that receives a jig and a boat supporting at least one die and forms an assembly, which is secured by a first robot. According to some embodiments, the jig is retrieved by a second robot from a jig carrier storing an inventory of available jigs. For example, the jig carrier comprises an array of shelves arranged in rows and columns. Each storage cell, corresponding to a unique intersection of row and column values, can store a jig, and information about the jig stored at each intersection or location can be maintained in a computer-accessible database. In some embodiments, the second robot comprises a robotic arm having a plurality of articulations allowing multi-axis movement. An example of the second robot includes an arm that is adjustable relative to 6-axes, allowing movement along or relative to each of the 6 axes.

The boat supporting at least one semiconductor die is supplied to and received by the assembler. For example, the boat, supporting the die comprising electronic circuitry that is to be subjected to a fabrication step, can be introduced to the system through an entry load port. In some embodiments, a conveyor is provided to transport the boat between the entry load port and the assembler, where the boat is incorporated into an assembly between portions of the jig.

The assembler comprises a separator, which separates the received jig into a first jig portion and a second jig portion, and a loader that positions the boat between the first jig portion and the second jig portion to form the assembly. For example, the separator can comprise a hoist that is supported by a rail and travels along a length of the rail. The hoist cooperates with a top of the jig, for example, and lifts the top of the jig up from a base of the jig. The separator then travels along the rail in a first direction to allow a loader to place the boat on top of the base of the jig, before the separator travels in an opposite direction to position the top of the jig above the boat resting on the base of the jig.

In some embodiments, the first robot receives the assembly prepared by the assembler. For example, the first robot can include an arm or other device that retrieves the assembly comprising the boat disposed between the top of the jig and the base of the jig from the assembler. According to some embodiments, the assembler delivers the assembly to the first robot, or a transport system is provided to convey the assembly between the assembler and the first robot.

Regardless of how the first robot receives or gains access to the assembly, the first robot comprises at least one mechanized tool that is operable under the control of electronic or computer-implemented control circuitry. In some embodiments, operation of the first robot manipulates a locking system of the assembly without manual user intervention to initiate or perform the manipulation of the locking system. For example, the manipulation described herein fixes an alignment of the boat relative to the first portion of the jig, the second portion of the jig, or both the first portion and the second portion of the jig.

To fix the relative arrangement of the portions of the jig and the boat, some embodiments of the assembly are transported by a conveyor belt or other transport system between the assembler and the first robot to bring the assembly within reach of the first robot. A mechanized tool is provided to the first robot to impart a compressive force on the boat between the top of the jig and base of the jig. For example, a torque wrench or other pivotal device exerts a rotational force at a defined torque on a threaded fastener forming part of a locking system provided to the assembly. In some embodiments, the torque wrench imparts a torque of at least one kilogram-foot (1 kg-ft) onto the threaded fastener or imparts a torque of between three kilogram-feet (3 kg-ft) and five kilogram-feet (5 kg-ft) onto the threaded fastener. The torque applied to the threaded fastener is chosen to be specific to the demands of the application.

According to some embodiments of the locking system, the threaded fastener is adjusted by the torque wrench to fix the alignment between the boat and at least one of the top of the jig or the base of the jig is described as one illustrative example. Other locking systems that are manipulated by the first robot to fix the relative arrangement of the boat and the at least one of the top of the jig or the base of the jig are also within the scope of the present disclosure. For example, any releasable fastener that can be manipulated by the first robot to fix or maintain the alignment between the boat and the first portion of the jig or the second portion of the jig during a processing operation and subsequently released can be utilized. Fixing the relative alignment between the boat and at least one portion of the jig with the locking system forms a locked assembly.

The locked assembly is then transported to a process chamber such as an oven, for example, where the locked chamber is subjected to an elevated temperature during a fabrication operation. In some embodiments, the second robot transfers the locked assembly to the process chamber. For example, the second robot places the locked assembly in the process chamber, deposits the locked chamber on a conveyor to be transported between the first robot and the process chamber, or otherwise sends the locked assembly to be placed within the process chamber.

In some embodiments, the locked assembly is subjected to the fabrication operation within the process chamber. An example of the process chamber is an oven, in which the locked assembly is subjected to an elevated temperature of at least one hundred Fahrenheit (100° F.). Another example of the process chamber is a deposition chamber, in which one or more layers are deposited on a substrate as part of a deposition process. The process chamber can be any chamber in which the locked assembly comprising the die(s) will be subjected to an operation as part of the process of manufacturing a semiconductor electronic device.

Once the operation performed in the process chamber is complete, some embodiments of the process involve returning the locked assembly to the first robot, which releases the threaded fastener or other locking system, without manual user intervention, to form an unlocked assembly. The unlocked assembly is transported to the assembler. In some embodiments, the assembler reverses the operations performed to insert the boat between the first portion and the second portion of the jig to form the assembly, thereby separating the boat from the unlocked assembly.

For example, some embodiments of the assembler lift the top of the jig from the unlocked assembly, exposing the boat. In some embodiments, the loader removes the boat from the base of the jig and causes the removed boat to be transported to an exit port, from where the boat is removed from the system. For example, a second conveyor can be provided to transport the boat removed from the jig by the assembler to the exit port.

With reference to the drawings, FIG. 1 illustrates a system 100 for manufacturing a semiconductor electronic device in accordance with some embodiments. As shown, the system 100 comprises at least one jig carrier 102, or a plurality of jig carriers 102, comprising a plurality of storage cells 104. The storage cells 104 are arranged in a configuration that allows the individual storage cells 104 to be assigned unique addresses. For example, as shown in FIG. 1, the storage cells 104 are arranged in rows and columns, with each storage cell 104 being identifiable by a respective intersecting row and column designator.

Some embodiments of the system 100 comprise an entry load port 106 through which a boat 300 (FIG. 3) supporting at least one die 302 is to be introduced to the system 100. The entry load port 106 is configured to receive a boat magazine 108 manually transported by a technician, transported by an overhead transport system, or transported by any other mode of transportation. For example, the entry load port 106 can be a mobile launch platform ("MLP") comprising a partition 110 defining an aperture 112 opening in an upward direction to allow the boat magazine 108 to be lowered by the overhead transport system and received by the entry load port 106. A boat magazine 108 stores a plurality of boats 300, each supporting one die 302 or a plurality of dies 302 that form portions of semiconductor electronic devices being fabricated during the fabrication process. The boat magazine 108 and boats 300 allow the die(s) 302 to be transported from one location to another as a batch.

For the embodiment illustrated in FIG. 1, the entry load port 106 is operatively coupled to an assembler 114. Being operatively coupled to the assembler 114 allows a conveyor 116, shuttle, or other transport system integrated as part of the entry load port 106 to deliver the boats 300 removed from the boat magazine 108 to the assembler 114 directly, without the involvement of an intervening or external transport device or human technicians, for example.

The jig carrier 102 and the entry load port 106 serve as sources of the components to be combined into an assembly 500 (FIG. 5) that is to be subjected to a fabrication operation by the system 100. According to some embodiments, and as described in greater detail below, the assembler 114 comprises a separator 602 (FIG. 6) that separates a jig 200 (FIG. 2) into a first jig portion 202 (FIG. 2) and a second jig portion 204. A loader 608 (FIG. 6) positions a boat 300 adjacent to the first jig portion 202 before the second jig portion 204 is placed above the boat 300 to form the assembly 500 comprising the boat 300 arranged between the first jig portions 202 and the second jig portion 204.

The assembly 500 is to be subjected to a fabrication operation within a process chamber 122 defined by a fabrication device 124. According to some embodiments, the fabrication device 124 is an oven, and the process chamber 122 (shown by dashed lines) is an oven cavity in which an elevated temperature of at least one hundred Fahrenheit (100° F.) is to be established. However, the fabrication device 124 is not limited to an oven. Some embodiments of the process chamber include, but are not limited to, a deposition chamber in which one or more layers are deposited on a substrate as part of a deposition process, an etching chamber in which a portion of a layer is etched away or otherwise removed, and the like. The process chamber 122 can be any chamber in which the assembly 500 is to be subjected to an operation as part of the process of manufacturing a semiconductor electronic device.

The system 100 comprises an automated material handling system to transport jigs 200 and boats 300 as described herein to control or reduce the manual intervention and transport (e.g., by human hand) between the introduction of components to be assembled and a time when the boat 300 exits an exit port 126. For example, a first robot 128 comprises a plurality of articulated arms 130. The articulated arms 130 are electronically actuated, driven by electric stepper motors or other actuators. The articulated arms 130 can comprise a plurality of axes, or degrees of freedom, to position a tool 132 adjacent to a distal end of the articulated arms 130 in positions to manipulate a locking system 206 (FIG. 2) that fixes the relative positions of the boat 300 and the first jig portion 202 and the second jig portion 204 as described below.

According to some embodiments, a second robot 134 comprises an articulated arm 136 comprising six axes of rotation or six degrees of freedom. The articulated arm 136 of the second robot 134 comprises a clamp 138 or other receiver that is compatible with the jig 200 to retrieve the jig 200 from the jig carrier 102 storing the inventory of available jigs. The articulated arm 136 of the second robot 134 is electronically actuated, driven by an electric stepper motor or other actuators. The actuators of the first robot 128 and the second robot 134 are independently controllable by a computer-implemented control system configured as a computing device 1112 (FIG. 11), for example, to automatically transport the jig 200, the boat 300, or a combination thereof automatically, without manual user intervention, for example. The above descriptions of the first robot 128 and the second robot 134 are merely illustrative, and not exhaustive of the constructions within the scope of the present disclosure.

According to some embodiments, the exit port 126 comprises a conveyor 140 that is operable to transport a boat 300 from the system 100 following completion of the fabrication operation on the die 302. Examples of the conveyor 140 include, but are not limited to, a conveyor belt, shuttle, roller table, or other device that receives a boat delivered by an adjacent conveyor and transports the boat 300 to an ambient environment of the system 100 through the exit port 126. The boat 300 can be manually retrieved and transported away from the exit port 126, retrieved by an overhead transport system, or otherwise removed from the exit port 126. In some embodiments, the exit port 126 is an MLP and comprises a partition 142 defining an aperture 144 through which an overhead transport system retrieves the boat 300 or the boat magazine 108 from the exit port 126.

Figure 2:
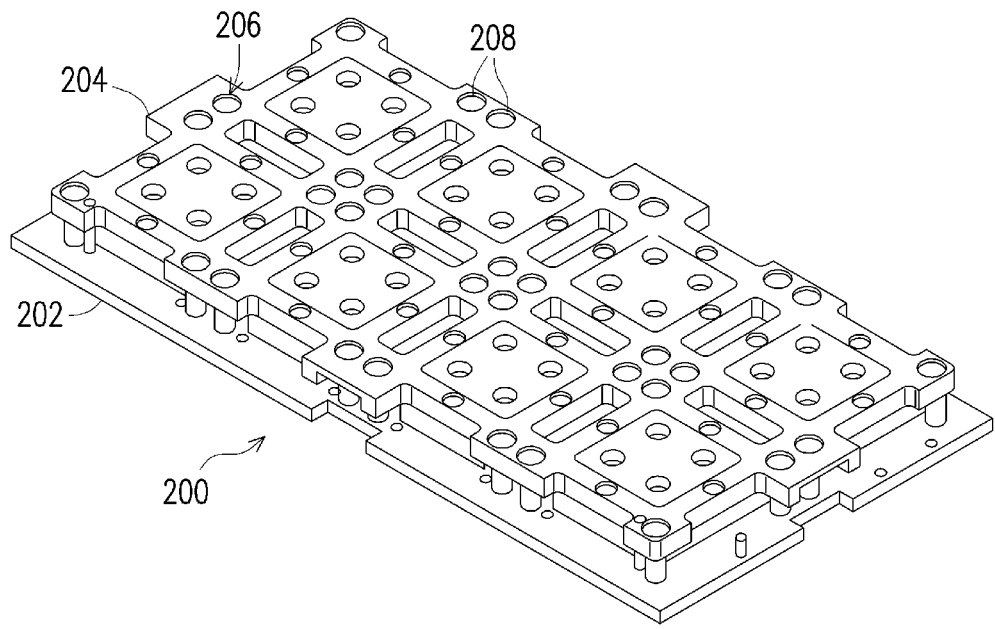
FIG. 2 is a perspective view of a jig, in accordance with some embodiments.

A perspective view of a jig 200 in accordance with some embodiments is shown in FIG. 2. As shown, the jig 200 comprises a first jig portion 202 forming a base of the jig 200 and a second jig portion 204 that is supported on top of the first jig portion 202. According to some embodiments, the second jig portion 204 is coupled to the first jig portion 202 by a locking system 206, shown in FIG. 2 as comprising a plurality of threaded fasteners 208, such as screws, bolts, etc., for example. A distance separating the second jig portion 204 from the first jig portion 202 is established by suitably manipulating the locking system 206 for the separation desired.

For example, the threaded fasteners 208 are pivotally adjustable in a first angular direction to insert the threaded fasteners 208 into compatibly threaded apertures to urge the second jig portion 204 toward the first jig portion 202. The threaded fasteners 208 are pivotally adjustable in a second angular direction, which is the opposite of the first angular direction, for example, to remove the threaded fasteners 208 from the compatibly threaded apertures, thereby releasing the locking system 206.

According to some embodiments, the tool 132 adjacent to the distal end of the articulated arms 130 is used to manipulate the locking system 206 to fix the alignment of the boat 300 relative to the first jig portion 202 and the second jig portion 204, without manual intervention, for example, to form a locked assembly 500 as described herein. For example, the embodiment of the tool 132 shown in FIG. 1 comprises a motor 146 that drives a bit 148. The bit 148 comprises a head that is compatible with a corresponding feature of the threaded fastener 208, transmitting angular movement of the bit 148 to the threaded fastener 208, thereby pivotally adjusting the threaded fasteners 208 of the jig 200. According to some embodiments, the head comprises a socket, a flat blade, a cross shape formed by orthogonal blades, a star shape, a hexagonal post, etc. At least a portion of the bit 148, such as the head, is formed from a metallic material comprising a Rockwell hardness of 60 HRC or less. Hardness values of 60 HRC or less mitigate the likelihood of damaging the threaded fasteners 208 while manipulating the locking system 206 with the torque described herein.

According to some embodiments, the tool 132 comprises a torque controlling module. The torque controlling module can be implemented as part of the computing device 1112 to control electric energy supplied to the motor 146 and apply a defined torque to the threaded fastener 208. The torque applied to the threaded fastener 208 can be correlated by the torque controlling module to apply a desired compressive force on the boat 300 positioned between the first jig portion 202 and the second jig portion 204. In some embodiments, the torque applied can be at least one kilogram-foot (1 kg-ft), up to kilogram-feet five (5 kg-ft). In some embodiments, the applied force is between three kilogram-feet (3 kg-ft) and five kilogram-feet (5 kg-ft). The torque applied to the threaded fastener 208 controls the compressive force exerted between the first jig portion 202 and the second jig portion 204. The compressive force urges an object, such as a heat sink, for example, separated from a surface of the die 302 by the thermal paste toward the die 302. Depending on the type and quantity of thermal paste applied to the surface of the die 302, the thermal paste is caused to spread over a substantial portion (e.g., at least 90%) of the surface of the die 302, or the entirety of the surface of the die 302 as a result of the compressive force, without damaging the die 302 to an extent that renders the semiconductor device inoperable.

In some embodiments, the locking system 206 is manipulated to establish a desired height of the assembly 500 comprising the boat 300 disposed between the first jig portion 202 and the second jig portion 204. The height of the assembly 500 is a dimension of the assembly 500 along an axis that is orthogonal to a major plane of the first jig portion 202, second jig portion 204, and boat 300. According to some embodiments, the locking system 206 is adjustable to establish a height of the assembly to be thirty millimeters (30 mm) or less, or twenty nine and seven tenths millimeters (29.7 mm) or less, or twenty five millimeters (25 mm) or less, or the like. However, other values of the height can be established within the scope of the present disclosure to meet the specific demands of a given application. For example, the height of the assembly 500 can be established to position an object, such as a heat sink, for example, in close proximity to a surface of the die 302 supporting thermal paste. Compression of the thermal paste in the small space between the object and the surface of the die 302 causes the thermal paste to spread over a surface of the die 302 supported by the boat 300, for example.

Figure 3:
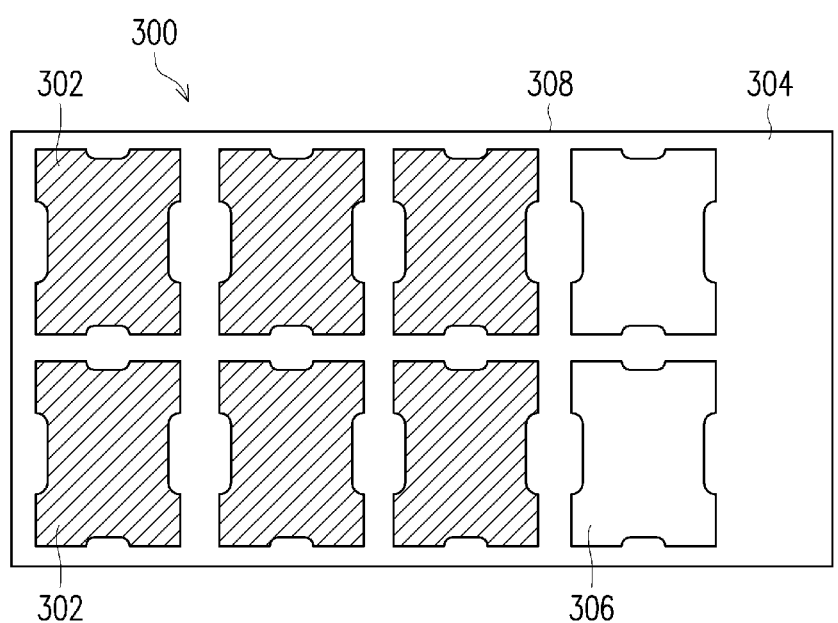
FIG. 3 is a top view of a boat supporting a plurality of dies, in accordance with some embodiments.
Figure 4:
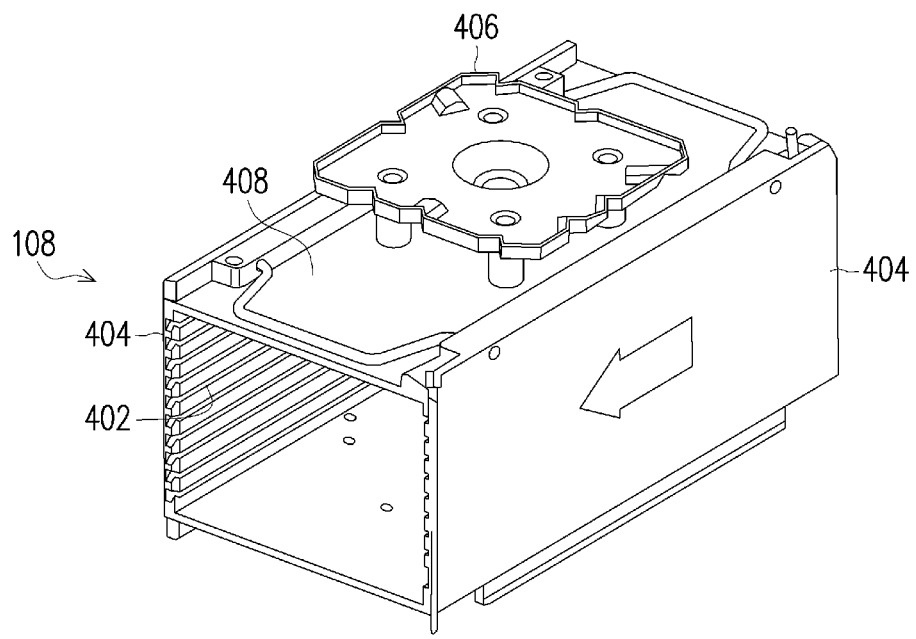
FIG. 4 is a perspective view of a boat magazine, in accordance with some embodiments.

FIG. 3 is a top view of a boat 300 supporting a plurality of dies 302 in accordance with some embodiments. The boat 300 comprises a frame 304 defining a plurality of receptacles 306 that separately receive different dies 302. A plurality of the boats 300 are received and transported collectively in a boat magazine 108, such as that illustrated in FIG. 4.

According to some embodiments, lateral side walls 308 (FIG. 3) of the boats 300 are received in apertures 402 (FIG. 4) formed in lateral side walls 404 of the boat magazine 108. According to some embodiments, the apertures 402 extend longitudinally, along a substantial extent of the lateral side walls 404, and opposing pairs of the apertures 402 are formed at a plurality of different vertical elevations along the lateral side walls 404 to receive opposite lateral side walls 308 of the boat 300. A plurality of boats 300 can be independently supported by a flange defining a bottom periphery of the apertures 402 formed in the lateral side walls 404. Accordingly, the boats 300 in the boat magazine 108 are vertically arranged one above another and spaced apart from each other within the boat magazine 108. In some embodiments, a head 406 extends upward from a ceiling 408 of the boat magazine 108. The head 406 is compatible with a receiver provided to the overhead transport system, allowing the boat magazine 108 to be transported and introduced to the entry load port 106 and retrieved and transported from the exit port 126 by the overhead transport system, for example.

Figure 5:
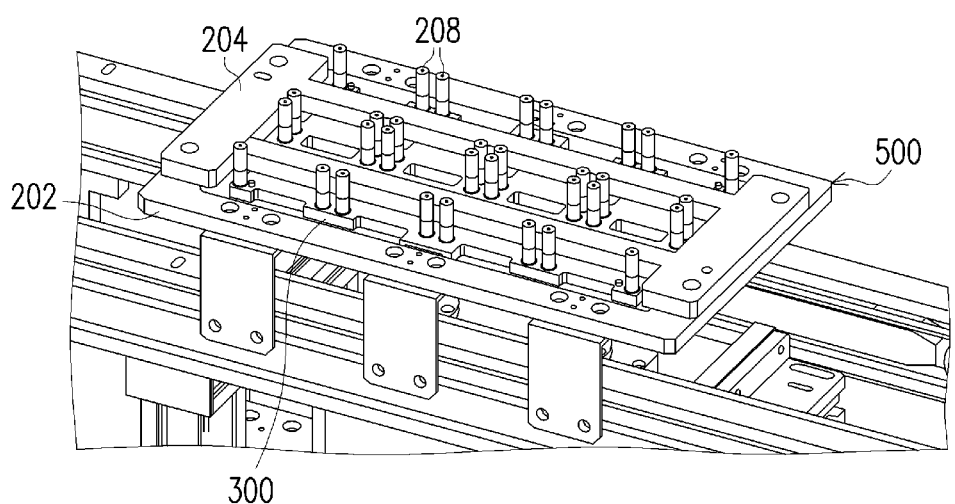
FIG. 5 is a perspective view of an assembly comprising a boat between jig portions, in accordance with some embodiments.

An illustrative example of the assembly 500 comprising the boat 300 disposed between the first jig portion 202 and the second jig portion 204 is shown in FIG. 5, in accordance with some embodiments. The position of the boat 300 relative to the first jig portion 202 or the second jig portion 204, or relative to both the first jig portion 202 and the second jig portion 204 is fixed, or otherwise maintained by cooperation between the threaded fasteners 208, the boat 300, and one or both of the first jig portion 202 and the second jig portion 204.

Figure 6:
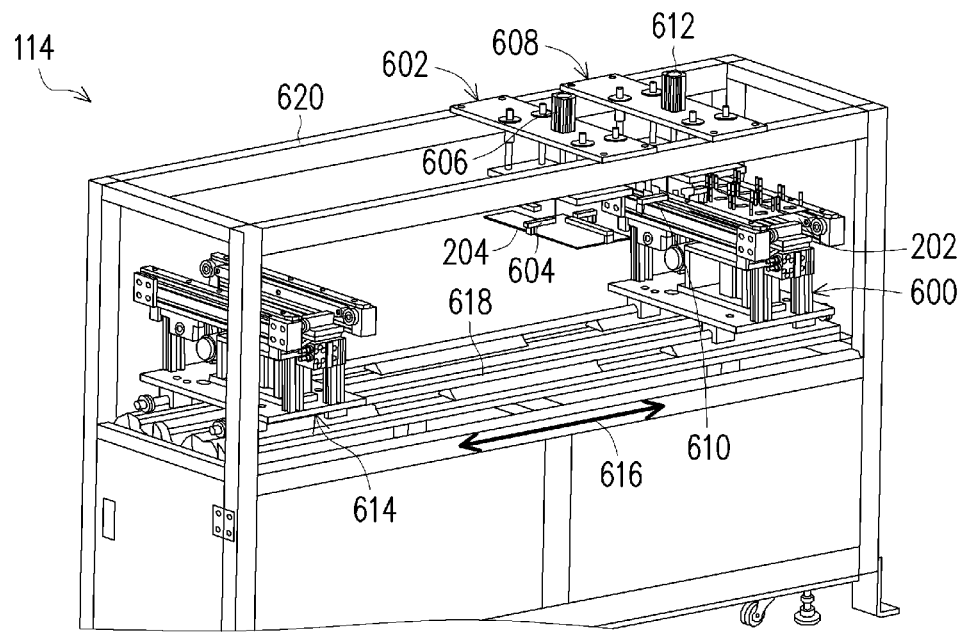
FIG. 6 is a perspective view of an assembler separating a second jig portion from a first jig portion to form an assembly of jig portions and a boat supporting a die, in accordance with some embodiments.

An illustrative embodiment of an assembler 114 is shown in FIG. 6. As shown, the assembler 114 comprises a first platform 600 that supports the jig 200 during the formation and disassembly of the assembly 500. A separator 602 which, according to some embodiments comprises a hoist 604 or other lifting device, separates the jig 200 into the first jig portion 202 and the second jig portion 204 by lifting the second jig portion 204 from the first jig portion 202. A linear actuator 606 or other actuator such as a hydraulic or pneumatic cylinder, for example, is operable to elevate and lower the second jig portion 204 relative to the first jig portion 202.

In some embodiments, the assembler 114 comprises a loader 608 that positions the boat 300 adjacent to the first jig portion 202 supported by the first platform 600. For example, the loader 608 shown in FIG. 6 comprises a hoist 610 or other lifting device that can be elevated and lowered relative to the first jig portion 202 on the first platform 600 by a linear actuator 612 or other actuator such as a hydraulic or pneumatic cylinder, for example. When the boat 300 is suspended vertically above the first jig portion 202 supported by the first platform 600, the linear actuator 612 is operable to lower the boat 300 onto the first jig portion 202. The hoist 610 releases the boat 300, thereby depositing the boat 300 onto the first jig portion 202.

According to some embodiments, the assembler 118 comprises a second platform 614. The second platform 614 is arranged adjacent to the conveyor 116 of the entry load port 106 to receive the boat 300 being introduced to the system 100. At least one of the first platform 600 and second platform 614 or the separator 602 and loader 608 are movable in longitudinal directions of the assembler 118, indicated generally by arrows 616. For example, the position of the first platform 600 is adjustable along a rail 618, or the separator 602 or the loader 608 are adjustable along a frame 620 to establish alignment between the first platform 600 or the second platform 614, and the separator 602, loader 608, or any other portion of the assembler 114. Alignment of the separator 602 with the first platform 600, for example, involves positing the separator 602 so the hoist 604 is arranged vertically above the first platform 600.

Figure 7:
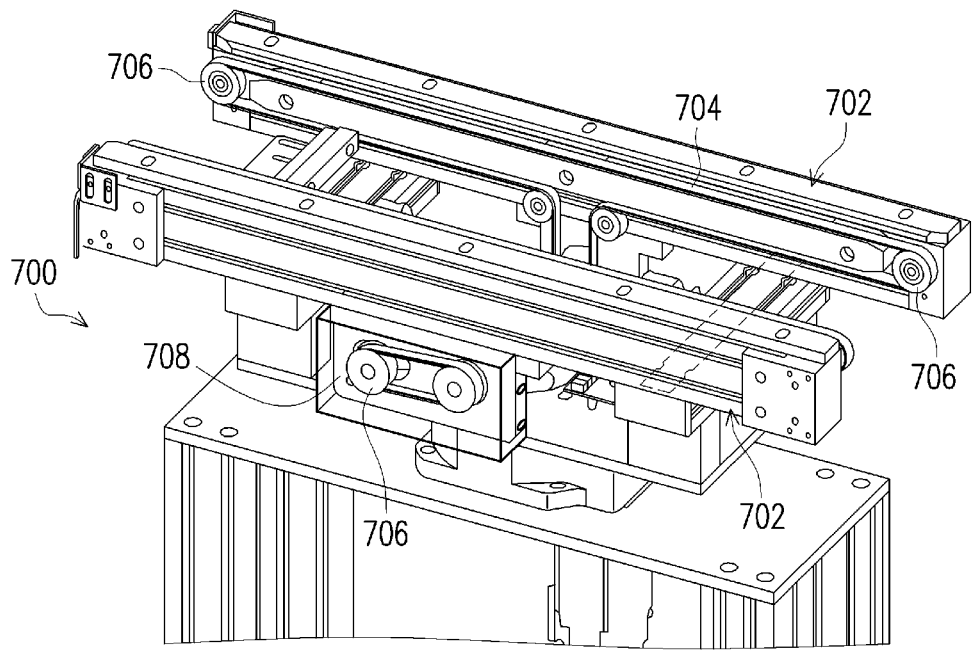
FIG. 7 is a perspective view of a transport system, in accordance with some embodiments.

An illustrative example of a transport system 700 that transports at least one of the first jig portion 202, the second jig portion 204, the boat 300, or a combination thereof within the system 100 is shown in FIG. 7. In some embodiments, the transport system 700 forms a portion of the conveyor 116, the first platform 600, the second platform 614, or any other conveyor or device described herein as transporting at least one of the first jig portion 202, the second jig portion 204, the boat 300, or a combination thereof within the system 100. According to some embodiments, the transport system 700 comprises a track 702. The track 702 comprises a continuous belt 704 that extends around a plurality of pulleys 706. At least one of the pulleys 706 is operatively connected to a drive motor 708. Activation of the drive motor 708 in a first direction causes the continuous belt 704 to travel in a first direction about the pulleys 706, and activation of the drive motor 708 in a second direction causes the continuous belt 704 to travel in a second direction about the pulleys 706. The second direction the continuous belt 704 travels is opposite to the first direction in which the continuous belt 704 travels.

The continuous belt 704 traveling in the first direction and the second direction transports at least one of the first jig portion 202, the second jig portion 204, the boat 300, or an assembly comprising a combination of the boat 300, the first jig portion 202, and the second jig portions 204 in different directions across the track 702. In some embodiments, the transport system 700 comprises a plurality of tracks 702, laterally spaced apart from each other as shown in FIG. 7, supporting the object being transported using the plurality of tracks 702. According to such embodiments, the drive motor 708 is operatively connected to one or more pulleys 706 provided to each of the tracks 702 and is operable to cause the continuous belt 704 of each track 702 to travel in one or more directions about the pulleys 706. According to other embodiments, a separate drive motor 708 is provided to independently drive the continuous belt 704 of the tracks 702 about the pulleys 706, or a drive motor 708 is provided to a first one of the plurality of tracks 702, and not to a second one of the plurality of tracks 702, to drive the continuous belt 704 of one of the tracks 702 but not the other.

Figure 8:
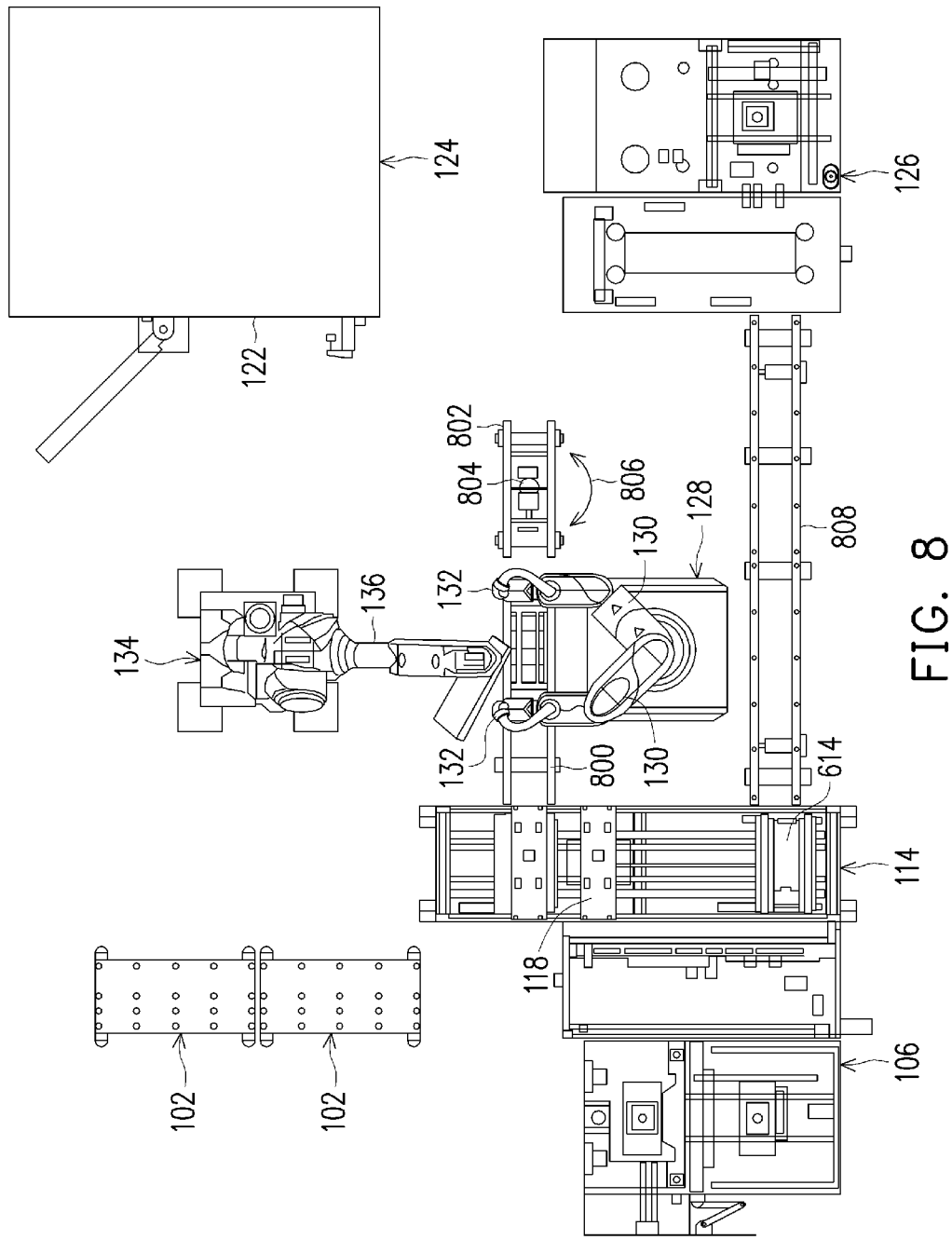
FIG. 8 is a top view of a system for manufacturing a semiconductor electronic device, in accordance with some embodiments.

According to some embodiments, the system 100 comprises an arrangement of transport systems 700 relative to the first robot 128 and the second robot 134, as illustrated in FIG. 8 that allows the first robot 128 and the second robot 134 to be utilized at a plurality of different times during a computer-implemented method of manufacturing a semiconductor electronic device. For example, a pre-press conveyor 800 is disposed between the first robot 128 and the second robot 134. In such a position, the pre-press conveyor 800 is accessible by both the first robot 128 and the second robot 134, allowing the first robot 128 and the second robot 134 to interact with objects on the pre-press conveyor 800, for example.

The second robot 134 is operable to transfer the jig 200 between the jig carrier 102 and the pre-press conveyor 800 and to return the jig 200 from the pre-press conveyor 800 to the jig carrier 102. In some embodiments, the second robot 134 is located adjacent to, or between, the jig carrier 102 and the fabrication device 124. From such a location, the second robot 134 transfers the jig 200 between the jig carrier 102 and the pre-press conveyor 800 and between the pre-press conveyor 800 and the fabrication device 124.

In some embodiments, a buffer station 802 is arranged adjacent to a first end of the pre-press conveyor 800 to receive the assembly 500 comprising the boat 300 arranged between the first jig portion 202 and the second jig portion 204. An illustrative embodiment of the buffer station 802 comprises the transport system 700 to transport the assembly 500. The buffer station 802 supports the assembly 500 at least one of before or after the assembly 500 is subjected to the fabrication operation in the process chamber 122, as needed, to control or reduce interruptions to the fabrication process. For example, an assembly 500 to be subjected to the fabrication operation is to be received by the buffer station 802. The pre-press conveyor 800 is operated to convey the assembly 500 to the buffer station 802, which is also operated, causing the assembly 500 to roll off of the tracks 702 of the pre-press conveyor 800 and onto the tracks 702 of the buffer station 802.

In some embodiments, the buffer station 802 is not accessible by the second robot 134. The buffer station 802 is pivotally adjustable about a central axis 804 in directions indicated by arrows 806. A portion of the assembly 500 on the buffer station 802 that is not accessible by the second robot 134 while the buffer station 802 is in a first angular orientation about the central axis 804, is accessible by the second robot 134 while the buffer station 802 is in a second angular orientation, different than the first angular orientation, about the central axis 804. For example, the buffer station 802 is oriented with a longitudinal axis parallel with a longitudinal axis of the pre-press conveyor 800 in a first orientation. The buffer station 802 is pivoted in a counter-clockwise direction a defined angle about the central axis 804 to the second orientation. The defined angle is any angle between fifteen degrees (15°) and one hundred sixty five degrees (165°), however, some embodiments of the defined angle that the buffer station 802 is pivotally adjustable from zero degrees (0°) to three hundred sixty degrees (360°). The angle that the buffer station 802 can be pivotally adjusted to the second angular orientation about the central axis 804 of the buffer station 802 is suitable to place the assembly 500 on the buffer station 802 within reach of the second robot 134. With the buffer station 802 adjusted to such a position, the second robot 134 is able to retrieve the assembly 500 from the buffer station 802, and introduce the assembly 500 to the process chamber 122.

In some embodiments, the second robot 134 transfers the assembly 500 from the process chamber 122 to the buffer station 802 after completion of the fabrication operation. For example, if the pre-press conveyor 800 is in use, the buffer station 802 is pivotally adjusted to the second angular orientation about the central axis 804. The second robot 134 retrieves the assembly 500 from the process chamber 122 and introduces the assembly 500 to the buffer station 802 in the second angular orientation. The buffer station 802 is pivotally adjusted to the first angular orientation about the central axis 804. When the pre-press conveyor 800 is no longer in use, or is available to receive the assembly 500 from the buffer station 802, the drive motor 708 of the buffer station 802 and the drive motor 708 pre-press conveyor 800 are activated, conveying the assembly 500 from the buffer station 802 to the pre-press conveyor 800.

Some embodiments of the system 100 utilize the jig carrier 102 to provide added buffer capacity or to provide storage capacity for the assembly 500 to cool after being exposed to an elevated temperature within the process chamber 122, in addition to storing the inventory of jigs 200. For example, the second robot 134 places the assembly 500, locked or unlocked, in a storage cell 104 of the jig carrier 102 to control or reduce the number of interruptions in the process caused by two or more objects being present at the same location within the system 100 at the same time. In some embodiments, the second robot 134 introduces the assembly 500 to a storage cell 104 to cool after being exposed to an elevated temperature in the process chamber 122, or otherwise as needed.

In some embodiments, the pre-press conveyor 800 is also accessible by the first robot 128. For such embodiments, the tool 132 provided adjacent to the distal end of each articulated arm 130 may manipulate the locking system 206 to maintain a relationship between the first jig portion 202 relative to the second jig portion 204 delivered to the first robot 128 by the pre-press conveyor 800 before performance of the fabrication operation. After the fabrication operation, the tool 132 provided adjacent to the distal end of each articulated arm 130 releases the locking system 206, for example.

According to some embodiments, a port conveyor 808 transports at least the boat 300 between the assembler 114 and the exit port 126. For example, the port conveyor 808 comprises the transport system 700 comprising one or a plurality of tracks 702 extending continuously between the assembler 114 and the exit port 126. The drive motor 708 of the port conveyor 808 is operable to cause the continuous belt 704 of the port conveyor 808 to travel about pulleys 706, transferring the boat 300 being conveyed from the second platform 614 of the assembler 114. In some embodiments, the port conveyor 808 extending between the assembler 114 and the exit port 126 is separated from a portion of the pre-press conveyor 800 by the first robot 128. For such embodiments, the entry load port 106, the port conveyor 808, and the exit port 126 form a boat side of the system 100, which does not receive the jig 200 as part of the manufacturing process.

Figure 9:
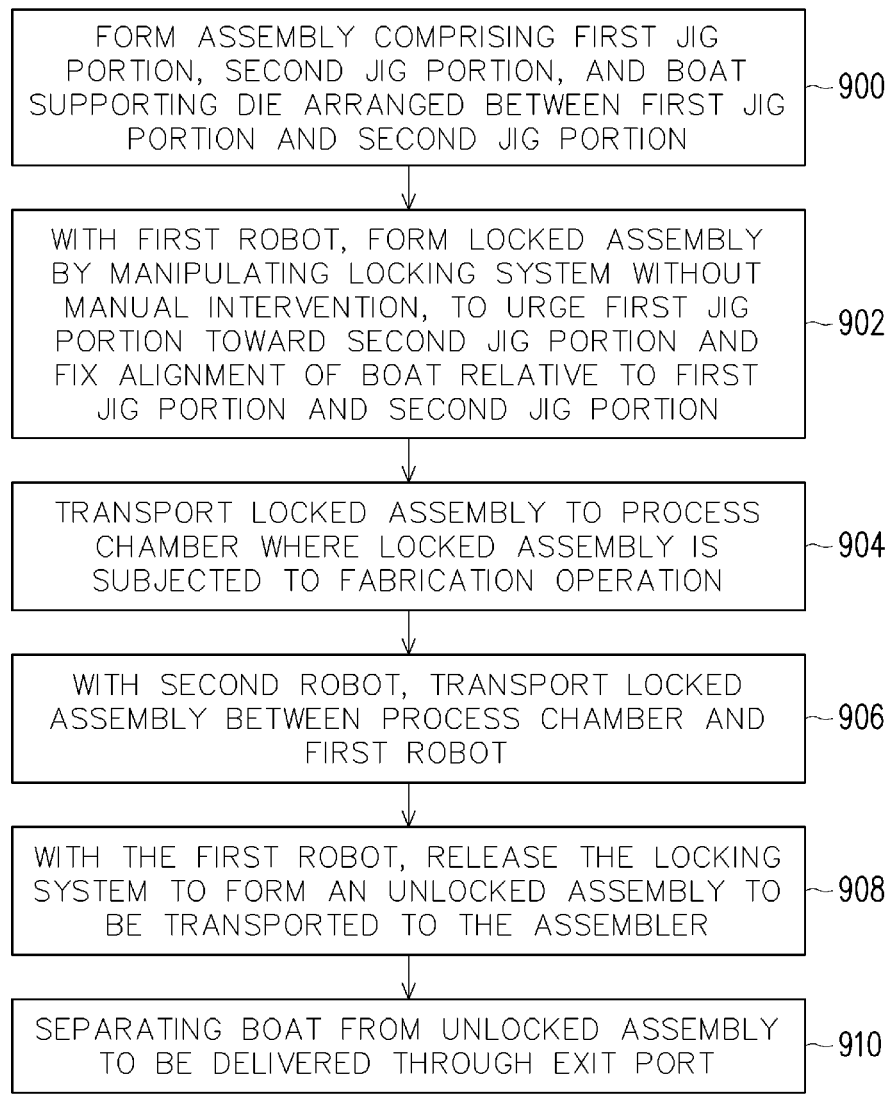
FIG. 9 is a flow chart illustrating a method of manufacturing a semiconductor electronic device, in accordance with some embodiments.

A flow chart illustrating a method of manufacturing a semiconductor electronic device in accordance with some embodiments is shown in FIG. 9. In some embodiments, the actions illustrated in FIG. 9 are performed under the control of a computer-implemented control system, such as computing device 1112 in FIG. 11 for example, executing computer-executable instructions stored by a non-transitory, computer-readable medium 1008, shown in FIG. 10. According to some embodiments, the method comprises forming the assembly 500 comprising the first jig portion 202, the second jig portion 204, and the boat 300 supporting a die, at block 900. The boat 300 is arranged between the first jig portion 202 and the second jig portion 204. More specifically, in some embodiments the second robot 134 is controlled to retrieve the jig 200 from the jig carrier 102 and deliver the jig 200 to the pre-press conveyor 800. The drive motor 708 of the pre-press conveyor 800 and the drive motor 708 of the first platform 600 are activated to transfer the jig 200 from the pre-press conveyor 800 to the assembler 114.

In some embodiments, the assembler 114 separates the second jig portion 204 from the first jig portion 202, places the boat 300 in a stack comprising the first jig portion 202, and places the second jig portion 204 on the assembly 500. For example, the relative position of the separator 602 and the first platform 600 is adjusted to position the hoist 604 vertically above the second jig portion 204. The first platform 600, the separator 602, or both the first platform 600 and the separator 602 are caused to travel parallel to the arrows 616 to establish vertical alignment between the hoist 604 and the second jig portion 204. When the separator 602 is arranged vertically above the first platform 600, the hoist 604 is lowered by the linear actuator 606, causing the hoist 604 to cooperate with the second jig portion 204, and then raised by the linear actuator 606 to lift the second jig portion 204 from the first jig portion 202.

The boat 300 retrieved from the boat magazine 108 that has been delivered to the entry load port 106 by an overhead transport system is transported by the conveyor 116 of the entry load port 106 to the second platform 614 of the assembler 114. The second platform 614, the loader 608, or both the second platform 614 and the loader 608 are caused to travel parallel to the arrows 616 to establish vertical alignment between the hoist 610 of the loader 608 and the boat 300 on the second platform 614. When the loader 608 is arranged vertically above the boat 300, the hoist 610 is lowered by the linear actuator 612, causing the hoist 610 to cooperate with the boat 300, and then raised by the linear actuator 612 to lift the boat 300 from the second platform 614. The loader 608 and the first jig portion 202 supported by the first platform 600 are brought into vertical alignment, and the hoist 610 coupled to the boat 300 is lowered by the linear actuator 612 to place the boat 300 on top of the first jig portion 202. Relative alignment of the separator 602 vertically above the second jig portion 204 is established, and the linear actuator 606 lowers the hoist 604 to deposit the second jig portion 204 onto the boat 300 supported by the first jig portion 202 on the first platform 600 to form the assembly 500.

In some embodiments, a locked assembly 500 is formed by the first robot 128 at block 902. For example, the assembly 500 is delivered to the first robot 128 as a result of activating the drive motor 708 of the first platform 600 and the drive motor 708 of the pre-press conveyor 800. The drive motor 708 of the pre-press conveyor 800 remains operational to position the assembly 500 adjacent to the first robot 128, within reach of the articulated arms 130, allowing the first robot 128 to manipulate the locking system 206 using the tool 132 provided to each of the articulated arms 130 without manual user intervention, for example. In some embodiments, the tools 132 are governed by the torque controlling module implemented as computer-executable instructions, to cause the tools to pivotally adjust threaded fasteners 208 with a torque of at least one kilogram-foot (1 kg-ft) onto the threaded fasteners 208. In some embodiments the applied torque is between three kilogram-feet (3 kg-ft) and five kilogram-feet (5 kg-ft).

In some embodiments, the second robot 134 is operable to transport the locked assembly 500 to the process chamber 122 of the fabrication device 124, where the locked assembly 500 is to be subjected to a processing operation. The locked assembly 500 is retrieved by the second robot 134 from the pre-press conveyor 800 and introduced to the process chamber 122. If there is an interruption in the process, the locked assembly 500 is transported to the buffer station 802 before being transported to the process chamber 122. The buffer station 802 is pivotally adjustable to position the locked assembly 500 within reach of the second robot 134, allowing the second robot 134 to retrieve the locked assembly 500 from the buffer station 802 and transport the locked assembly 500 to the process chamber 122.

Once in the process chamber 122, the locked assembly 500 is subjected to a fabrication operation at block 904. An example of the fabrication device 124 includes an oven chamber as the process chamber 122, in which the locked assembly 500 is exposed to an elevated temperature of at least one hundred Fahrenheit (100° F.). Other examples of the process chamber 122 include a deposition chamber in which a material is deposited on the die 302 supported by the boat 300, a test chamber in which a test is performed on the die 302, an etching chamber in which a portion of the die 302 is removed, etc.

Following completion of the fabrication operation, the second robot 134 retrieves the locked assembly 500 and transports the locked assembly 500 between the process chamber 122 and the first robot 128 at block 906. The second robot 134 transports the locked assembly 500 to the pre-press conveyor 800 or, if there is an interruption in the process, to the buffer station 802 until a time when the interruption has been resolved. For example, the interruption includes the pre-press conveyor 800 being occupied by another assembly 500 to be transported to the fabrication device 124 or another locked assembly 500 being unlocked before being transported back to the assembler 114.

In some embodiments, the first robot 128 again manipulates the locking system 206 at block 908 to release the locking system 206 and form an unlocked assembly 500 that is transported to the assembler 114. For example, the first robot 128 forms the unlocked assembly 500 by pivotally adjusting the threaded fasteners 208 using the tools 132, without manual intervention, for example. The drive motor 708 of the pre-press conveyor 800 and the drive motor 708 of the first platform 600 are operated to return the unlocked assembly 500 to the assembler 114.

The unlocked assembly 500 is returned to the first platform 600 of the assembler 114, where the unlocked assembly 500 is disassembled by separating the boat 300 from the first jig portion 202 and the second jig portion 204 at block 910. For example, relative alignment between the separator 602 and the unlocked assembly 500 is established by adjusting the position of at least one of the separator 602 or the first platform 600 in directions parallel with arrows 616. The linear actuator 606 is activated to lower the hoist 604 and engage the second jig portion 204. The linear actuator 606 of the separator 602 is controlled to elevate the hoist 604 and lift the first jig portion 202 from the boat 300. The loader 608 is brought into alignment with the first platform 600, and the linear actuator 606 controls the elevation of the hoist 610 to lift the boat 300 from the first jig portion 202.

In some embodiments, the loader 608 is brought into alignment with the second platform 614, and the linear actuator 612 is controlled to deposit the boat 300 onto the second platform 614. The drive motor 708 of the second platform 614 and the drive motor 708 of the port conveyor 808 are activated, transferring the boat 300 to the port conveyor 808. The port conveyor 808 is operated to transport the boat 300 to the exit port 126, where the boat 300 is introduced to a boat magazine 108 to be retrieved and transported away from the system 100 by an overhead transport system.

Figure 10:
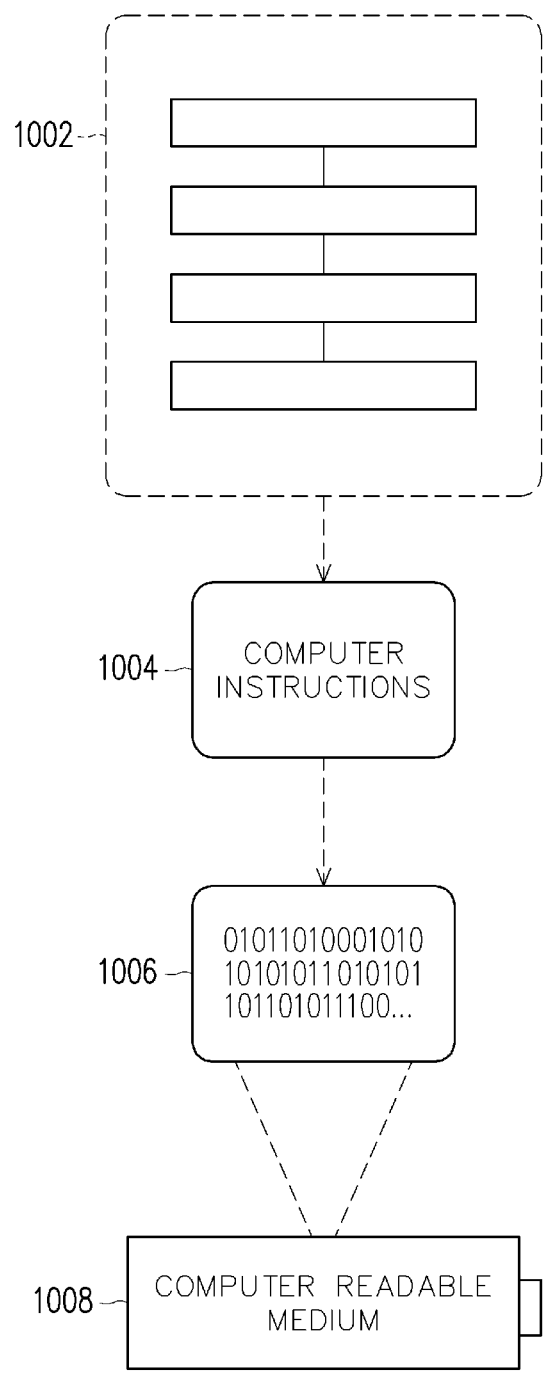
FIG. 10 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium 1008 is illustrated in FIG. 10, and is embodied as a CD-R, DVD-R, flash drive, a platter of a hard disk drive, etc., on which is encoded computer-readable data 1006. This computer-readable data 1006 in turn comprises a set of processor-executable computer instructions 1004 configured to operate according to one or more of the principles set forth herein. In some embodiments, the processor-executable computer instructions 1004 are configured to perform a method 1002, such as at least some of the aforementioned described methods. In some embodiments, the processor-executable computer instructions 1004 are configured to implement a system, such as at least some of the aforementioned systems. Many such computer-readable media may be devised by those of ordinary skill in the art that are configured to operate in accordance with the techniques presented herein.

Figure 11:
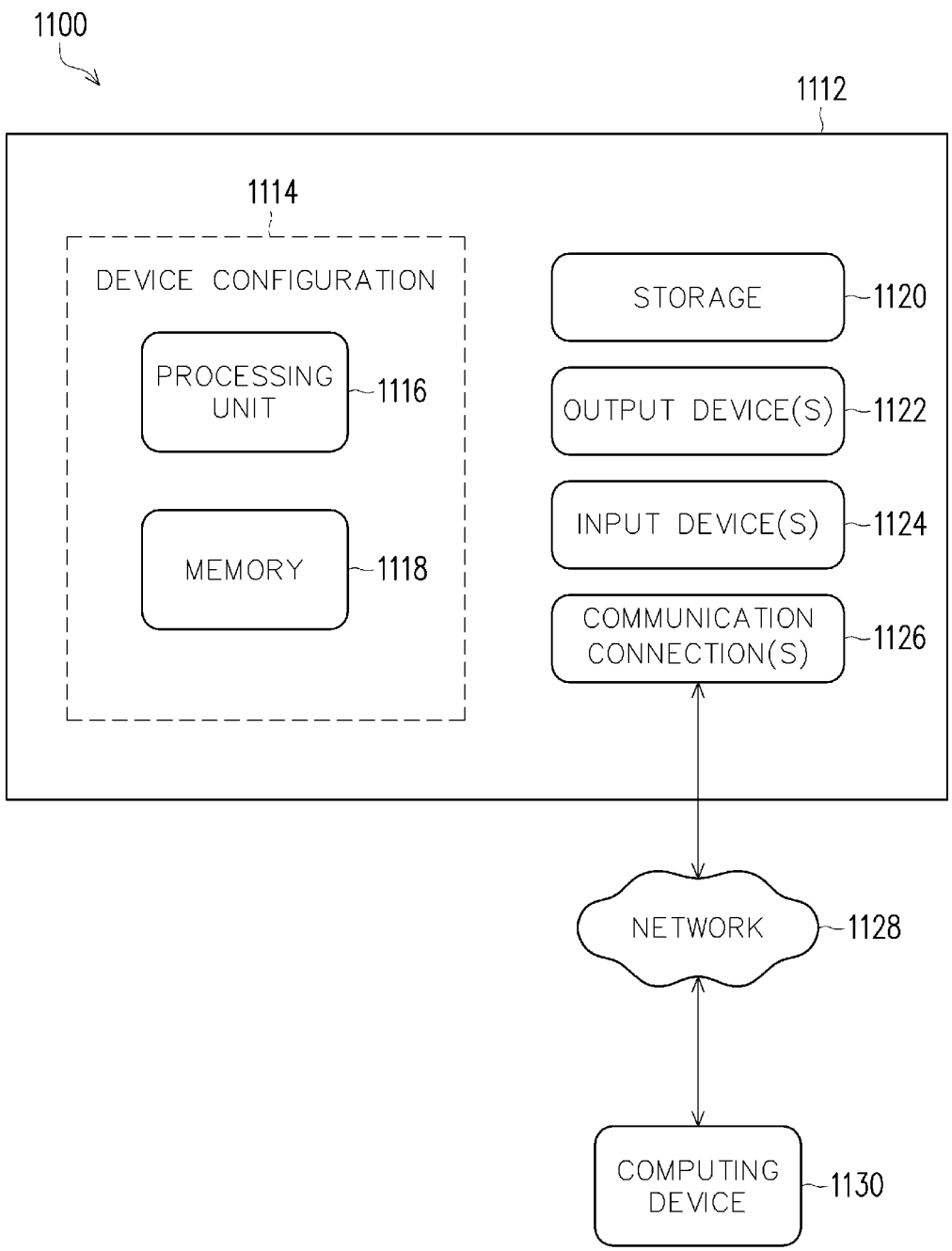
FIG. 11 illustrates an example computing environment wherein one or more of the provisions set forth herein may be implemented, in accordance with some embodiments.

FIG. 11 and the following discussion provide a brief, general description of a suitable computing environment to implement embodiments of one or more of the provisions set forth herein. The operating environment of FIG. 11 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 11 depicts an example of a system 1100 comprising a computing device 1112 configured as the controller system to implement some embodiments provided herein. In some configurations, computing device 1112 includes at least one processing unit 1116 and memory 1118. Depending on the exact configuration and type of computing device, memory 1118 may be volatile (such as RAM, for example), nonvolatile (such as ROM, flash memory, etc., for example) or some combination of the two. This configuration is illustrated in FIG. 11 by dashed line 1114.

In some embodiments, computing device 1112 may include additional features and/or functionality. For example, computing device 1112 may also include additional storage (e.g., removable and/or non-removable) including, but not limited to, magnetic storage, optical storage, and the like. Such additional storage is illustrated in FIG. 11 by storage 1120. In some embodiments, computer readable instructions to implement one or more embodiments provided herein may be in storage 1120. Storage 1120 may also store other computer readable instructions to implement an operating system, an application program, and the like. Computer readable instructions may be loaded in memory 1118 for execution by processing unit 1116, for example.

The term "computer readable media" as used herein includes computer storage media. Computer storage media includes volatile and nonvolatile, removable and non-removable media implemented in any method or technology for storage of information such as computer readable instructions or other data. Memory 1118 and storage 1120 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1112. Any such computer storage media may be part of computing device 1112.

Computing device 1112 may also include communication connection(s) 1126 that allows computing device 1112 to communicate with other devices. Communication connection(s) 1126 may include, but is not limited to, a modem, a Network Interface Card (NIC), an integrated network interface, a radio frequency transmitter/receiver, an infrared port, a USB connection, or other interfaces for connecting computing device 1112 to other computing devices. Communication connection(s) 1126 may include a wired connection or a wireless connection. Communication connection(s) 1126 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Computing device 1112 may include input device(s) 1124 such as keyboard, mouse, pen, voice input device, touch input device, infrared cameras, video input devices, and/or any other input device. Output device(s) 1122 such as one or more displays, speakers, printers, and/or any other output device may also be included in computing device 1112. Input device(s) 1124 and output device(s) 1122 may be connected to computing device 1112 via a wired connection, wireless connection, or any combination thereof. In some embodiments, an input device or an output device from another computing device may be used as input device(s) 1124 or output device(s) 1122 for computing device 1112.

Components of computing device 1112 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In some embodiments, components of computing device 1112 may be interconnected by a network. For example, memory 1118 may be comprised of multiple physical memory units located in different physical locations interconnected by a network.

Those skilled in the art will realize that storage devices utilized to store computer readable instructions may be distributed across a network. For example, a computing device 1130 accessible via a network 1128 may store computer readable instructions to implement one or more embodiments provided herein. Computing device 1112 may access computing device 1130 and download a part or all of the computer readable instructions for execution. Alternatively, computing device 1112 may download pieces of the computer readable instructions, as needed, or some instructions may be executed at computing device 1112 and some at computing device 1130.

In some embodiments, configuring the system 100 to position the first robot 128 and the second robot 134 adjacent to the jig carrier 102, the assembler 114, the fabrication device 124, and the transport systems 700 controls or reduces manual intervention required to fabricate a semiconductor electronic device. Additionally, efficient use of the first robot 128 and the second robot 134 is made at various points during the manufacturing process to control or reduce interruptions to the process and control or reduce the need for separate material handling systems, for example.

According to some embodiments, a system for manufacturing a semiconductor electronic device is provided herein. The system includes an assembler configured to receive a jig and a boat supporting a die. The assembler includes a separator configured to separate the jig into a first jig portion and a second jig portion and a loader configured to position the boat adjacent to the first jig portion. The separator is configured to position the second jig portion adjacent to the boat to form an assembly including the boat arranged between the first jig portion and the second jig portion. A robot is configured to receive the assembly prepared by the assembler and manipulates a locking system that fixes an alignment of the boat relative to the first jig portion and the second jig portion to form a locked assembly. A process chamber is configured to receive the locked assembly and subjects the locked assembly to a fabrication operation.

According to some embodiments, a method of manufacturing a semiconductor electronic device is provided herein. The method includes forming an assembly including a first jig portion, a second jig portion, and a boat supporting a die arranged between the first jig portion and the second jig portion. With a first robot, a locked assembly is formed by manipulating a locking system to urge the first jig portion toward the second jig portion and fix an alignment of the boat relative to the first jig portion and the second jig portion. The locked assembly is subjected to a fabrication operation within a process chamber, before the first robot forms an unlocked assembly by releasing the locking system. The boat is separated from the unlocked assembly.

According to some embodiments, a non-transitory computer-readable medium storing instructions that, when executed by a processor of a computer-implemented control system, cause the computer-implemented control system to perform a process of manufacturing a semiconductor electronic device is provided herein. The manufacturing process includes retrieving, with a first robot, a jig from a jig carrier storing an inventory of available jigs. The jig includes a first jig portion and a second jig portion. The jig is delivered to an assembler, and a boat supporting a die is introduced to the assembler by an entry load port. The assembler arranges the boat between the first jig portion and the second jig portion to form an assembly, which is transported by a first conveyor to a second robot. The second robot manipulates a locking system of the assembly to form a locked assembly, thereby urging the first jig portion toward the second jig portion and exerting a compressive force on the boat. The first robot delivers the locked assembly to a processing chamber in which the locked assembly is to be subjected to a fabrication operation. The first robot returns the locked assembly to the second robot after completion of the fabrication operation, and the second robot releases the locking system to form an unlocked assembly. The unlocked assembly is transported to the assembler, which separates the boat from the unlocked assembly, and the boat is delivered by a second conveyor to an exit port.

It will be appreciated that the features, elements, etc. are not limited to the specific configurations, compositions, arrangements, embodiments, etc. mentioned herein. In some embodiments, one or more of the configurations, compositions, arrangements, etc. mentioned herein comprise one or more structures, functionalities, etc. different than what is mentioned herein.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described, or some or all of the structures are arranged should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that the configurations, compositions, arrangements, features, arrangements, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" or "illustrative" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure includes all such modifications and alterations and is limited only by the scope of the following claims. In particular regard to the various functions performed by the above described components the terms used to describe such components are intended to correspond, unless otherwise indicated, to any component which performs the specified function of the described component (for example, a term that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system for manufacturing a semiconductor electronic device, comprising:
   an assembler configured to receive a jig and a boat supporting a die, wherein the assembler comprises:
      a separator configured to separate the jig into a first jig portion and a second jig portion, and
      a loader configured to position the boat adjacent to the first jig portion, wherein the separator is configured to position the second jig portion adjacent to the boat to form an assembly comprising the boat arranged between the first jig portion and the second jig portion;
   a robot configured to receive the assembly prepared by the assembler and manipulate a locking system that fixes an alignment of the boat relative to the first jig portion and the second jig portion to form a locked assembly; and
   a process chamber configured to receive the locked assembly and subject the locked assembly to a fabrication operation.

2. The system of claim 1, comprising:
   a jig carrier configured to store an inventory comprising a plurality of available jigs; and
   a second robot configured to retrieve the jig from the inventory stored by the jig carrier and supply the jig to the assembler.

3. The system of claim 1, comprising:
   an entry load port through which the boat is introduced to the system, wherein the entry load port is operatively coupled to the assembler and configured to deliver the boat introduced through the entry load port to the assembler.

4. The system of claim 1, comprising a pre-press conveyor positioned adjacent to the robot, wherein the pre-press conveyor is operable in a first state to transport the jig to the assembler and is operable in a second state to transport the assembly prepared by the assembler to the robot.

5. The system of claim 1, comprising:
   an exit port; and
   a port conveyor, wherein:
      the robot is configured to receive the locked assembly following completion of the fabrication operation and releases the locking system to form an unlocked assembly,
      the assembler is configured to separate the boat from the unlocked assembly, and
      the port conveyor is configured to transport the boat that has been separated from the unlocked assembly between the assembler and the exit port.

6. The system of claim 1, wherein the robot comprises a tool configured to pivotally adjust a threaded fastener of the locking system to urge the second jig portion toward the first jig portion and exert a compressive force on the boat between the first jig portion and the second jig portion.

7. The system of claim 6, wherein the robot comprises a torque controlling module configured to establish a defined torque to be exerted by the tool on the threaded fastener.

8. The system of claim 7, wherein the defined torque established by the torque controlling module is at least one kilogram-foot and no greater than five kilogram-feet.

9. The system of claim 1, wherein the process chamber is an oven configured to generate a temperature of at least one hundred Fahrenheit to which the locked assembly is subjected.

10. A method of manufacturing a semiconductor electronic device, comprising:
   separating a jig into a first jig portion and a second jig portion;
   forming, by a loader, an assembly comprising the first jig portion, the second jig portion, and a boat supporting a die arranged between the first jig portion and the second jig portion;
   with a first robot, forming a locked assembly by manipulating a locking system to urge the first jig portion toward the second jig portion and fix an alignment of the boat relative to the first jig portion and the second jig portion;
   subjecting the locked assembly to a fabrication operation within a process chamber;
   with the first robot, forming an unlocked assembly by releasing the locking system after completion of the fabrication operation; and
   separating the boat from the unlocked assembly.

11. The method of claim 10, wherein forming the assembly comprises:
   with a second robot, retrieving the first jig portion and the second jig portion from a jig carrier storing an inventory of available jig portions;
   receiving the boat supporting the die through an entry load port; and transporting the first jig portion, the second jig portion, and the boat to an assembler that positions the boat between the first jig portion and the second jig portion.

12. The method of claim 10, wherein manipulating the locking system comprises pivotally adjusting a threaded fastener of the locking system to urge the first jig portion toward the second jig portion and exert a compressive force on the boat between the first jig portion and the second jig portion.

13. The method of claim 12, wherein pivotally adjusting the threaded fastener comprises exerting a torque of at least one kilogram-foot and no greater than five kilogram-feet on the threaded fastener.

14. The method of claim 10, wherein subjecting the locked assembly to the fabrication operation comprises:
 introducing the locked assembly to an oven; and
 exposing the locked assembly to a temperature of at least one hundred Fahrenheit within the oven.

15. The method of claim 10, comprising operating a conveyor that transports the boat separated from the unlocked assembly to an exit port.

16. A non-transitory computer-readable medium storing instructions that, when executed by a processor of a computer-implemented control system, cause the computer-implemented control system to:
 retrieve, with a first robot, a jig from a jig carrier storing an inventory of available jigs, wherein the jig comprises a first jig portion and a second jig portion;
 deliver the jig to an assembler;
 introduce, with an entry load port, a boat supporting a die to the assembler;
 arrange, with the assembler, the boat between the first jig portion and the second jig portion to form an assembly, wherein the assembler comprises:
  a separator configured to separate the jig into the first jig portion and the second jig portion, and
  a loader configured to position the boat adjacent to the first jig portion, wherein the separator is configured to position the second jig portion adjacent to the boat to form the assembly comprising the boat arranged between the first jig portion and the second jig portion;
 transport the assembly with a first conveyor to a second robot;
 manipulate, with the second robot, a locking system of the assembly to form a locked assembly by urging the first jig portion toward the second jig portion and exerting a compressive force on the boat;
 deliver, with the first robot, the locked assembly to a processing chamber in which the locked assembly is to be subjected to a fabrication operation;
 with the first robot, return the locked assembly to the second robot after completion of the fabrication operation;
 release the locking system with the second robot to form an unlocked assembly;
 transport the unlocked assembly to the assembler;
 separate the boat from the unlocked assembly with the assembler; and
 deliver, with a second conveyor, the boat to an exit port.

17. The non-transitory computer-readable medium of claim 16, wherein the jig retrieved from the jig carrier by the first robot is delivered to the assembler by the first conveyor.

18. The non-transitory computer-readable medium of claim 16, wherein the second robot manipulates the locking system by pivotally adjusting a threaded fastener of the locking system.

19. The non-transitory computer-readable medium of claim 18, wherein the instructions define a torque of at least one kilogram-foot and no greater than five kilogram-feet to be exerted on the threaded fastener.

20. The non-transitory computer-readable medium of claim 16, wherein the processing chamber is an oven, and the instructions, when executed by the processor of the computer-implemented control system, cause the computer-implemented control system to establish a temperature within the oven of at least one hundred Fahrenheit.

* * * * *